United States Patent [19]

Feuerbaum et al.

[11] 4,412,191

[45] Oct. 25, 1983

[54] METHOD AND ARRANGEMENT FOR QUANTITATIVE POTENTIAL MEASUREMENTS ON SURFACE-WAVE FILTERS

[75] Inventors: Hans P. Feuerbaum; Gerald Tobolka, both of Munich, Fed. Rep. of Germany

[73] Assignee: Siemens Aktiengesellschaft, Berlin & Munich, Fed. Rep. of Germany

[21] Appl. No.: 287,133

[22] Filed: Jul. 27, 1981

[30] Foreign Application Priority Data

Sep. 29, 1980 [DE] Fed. Rep. of Germany ....... 3036713

[51] Int. Cl.$^3$ .......................... H03H 9/64; H03H 9/00
[52] U.S. Cl. .............................. 333/193; 310/313 R; 333/150
[58] Field of Search ................. 333/150-155, 333/193-196; 310/313 R

[56] References Cited

U.S. PATENT DOCUMENTS 3,689,782  9/1972  Epszein ..................... 333/154 X
3,886,503  5/1975  Bert et al. .................... 333/150
3,903,486  9/1975  Bert et al. .................... 333/152

OTHER PUBLICATIONS

Fuerbaum et al.—"Visualization of Travelling Surface Acoustic Waves Using a Scanning Electron Microscope", Scanning Electron Microscopy/1980/I, SEM Inc., AMF O'Hare (Chicago), IL 60666, USA; pp. 502-508.

Fuerbaum—"VSLI Testing Using the Electron Probe", Scanning Electron Microscopy/1979/I, SEM Inc., AMF O'Hare, (Chicago), IL 60666, USA; pp. 285-296.

Bert et al.—"Signal Processing by Electron-Beam Interaction with Piezoelectric Surface Waves", IEEE Trans. on Microwave Theory and Techniques, vol. MTT-21, No. 4, Apr. 1973, 255-263.

Primary Examiner—Marvin L. Nussbaum
Attorney, Agent, or Firm—Hill, Van Santen, Steadman & Simpson

[57] ABSTRACT

For quantitative potential measurement of surface-wave filters, an alternating voltage with amplitude $U_{Ei}$ is connected to an input transducer of the surface-wave filter. At a local region for measurement on the filter, an alternating voltage of amplitude $U_P$ arises. For each such measuring location, the voltage $U_P$ is compared to a nominal value and if it deviates therefrom, this deviation is utilized to control an amplitude of the input voltage $U_{Ei}$ so as to maintain the voltage $U_P$ substantially constant. For the various measurement locations, the changes of the input voltage $U_{Ei}$ are analyzed and a local attenuation factor for each measured region in the filter may be determined. By knowing a frequency of the driving alternating voltage, conclusions can be drawn concerning specific characteristics of the filter.

4 Claims, 1 Drawing Figure

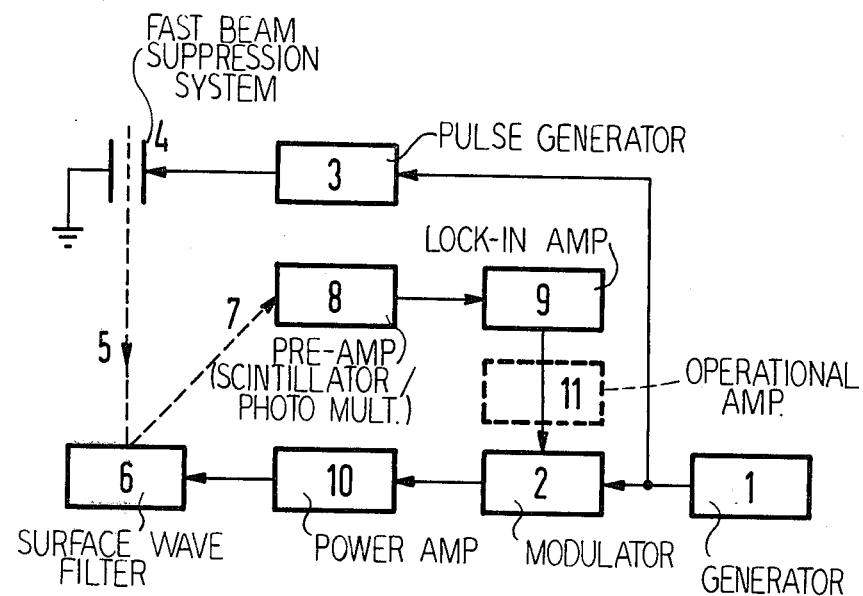

METHOD AND ARRANGEMENT FOR QUANTITATIVE POTENTIAL MEASUREMENTS ON SURFACE-WAVE FILTERS

BACKGROUND OF THE INVENTION

The invention relates to a method and to an arrangement for quantitative potential measurement of surface-wave filters.

By means of measuring the potential contrast, electron beam measuring or testing devices (which are well known in the art) allow an imaging of the potential distribution in surface-wave filters. Electron beam measuring devices thus make a qualitative statement concerning the local potential in surface-wave filters possible. However, the demand for a local, quantitative potential measurement also exists for the measurement of specific filter characteristics of surface-wave filters. The purpose of the invention is to provide quantitative potential measurements on surface-wave filters.

Up to now, such measurements were carried out with a mechanical test probe by means of capacitive coupling. A potential measurement with the assistance of secondary electrons as is employed in semiconductor circuits with the use of electron beam testing devices fails in the measurement of surface-wave filters because of the charge which thereby occurs.

SUMMARY OF THE INVENTION

An object of the invention is to specify a method and an arrangement for quantitative potential measurement at surface-wave filters with a high chronological and spatial resolution.

This object is achieved in that given an alternating voltage with amplitude $U_{Ei}$ adjacent an input transducer of the surface-wave filter, the overall period of the alternating voltage signal course with the local amplitude $U_P$ is stroboscopically locally sampled according to the sampling principle in a short time by a pulsed electron beam with the assistance of an electron beam measuring device. The secondary electron alternating current signal which therefore arises with amplitude $I_{AC}$ is measured and is compared to a rated value which is the same for all local measurements. The deviation from the rated value is then amplified, and this deviation controls the amplitude of a power amplifier which in turn drives the surface-wave filter with the alternating voltage amplitude $U_{Ei}$. By means of comparing various amplitudes $U_{Ei}$ of the alternating voltage connected to the surface-wave filter for various regions or measuring points, conclusions can be made concerning the surface attenuation path of the surface-wave filter and thus, as a function of the frequency of the alternating voltage, conclusions concerning specific filter characteristics can be arrived at.

An arrangement for quantitative potential measurement at surface-wave filters according to the invention may be designed in such manner that a generator charges a modulator and a pulse generator with an alternating voltage. The pulse generator drives a fast beam suppression system of a modified, stroboscopic electron beam measuring device. Primary electrons of the electron beam trigger secondary electrons when they strike the surface-wave filter to be investigated. The surface-wave filter is driven by the modulator via a power amplifier. The secondary electron/alternating current signal thus arising first passes a preamplifier and then an amplifier device which amplifies the deviation of the amplitude $I_{AC}$ of the secondary electron/alternating current signal from the rated value and drives the amplitude of the power amplifier via the modulator.

Advantageously, a lock-in amplifier is employed as well as an operational amplifier for the measurement of the secondary electron/alternating current signal, for the comparison of this signal to the rated value, and for the amplification of the deviation of the signal from the rated value.

BRIEF DESCRIPTION OF THE DRAWING

The drawing FIGURE shows in block diagram format an arrangement for quantitative potential measurement of surface-wave filters.

DESCRIPTION OF THE PREFERRED EMBODIMENTS

The FIGURE shows an arrangement for quantitative potential measurement of surface-wave filters. The measurement ensues stroboscopically according to the sampling principle. A method and an arrangement for qualitative potential measurement at surface-wave filters with an electron beam measuring device is described by G. Eberharter and H. P. Feuerbaum and G. Tobolka: SEM Inc., AMF O'Hare (Chicago) 1980, Vol. I, pp. 503–508, incorporated herein by reference. In the aforementioned article, the prior art electron beam measuring device employed for the visualization of travelling surface waves is described in detail in the article "VLSI Testing Using the Electron Probe", H. P. Feuerbaum, SEM/1979/I, SEM Inc., AMF O'Hare, Illinois 60666, pages 285–318 (Footnote 7 referenced at page 506 of the aforementioned article).

This arrangement is to be modified in such manner that a generator 1 charges a modulator 2 and a pulse generator 3 with a high-frequency alternating voltage, whereby the pulse generator 3 drives a fast beam suppression system of the modified electron beam device well-known in the prior art from the cited publication. The primary electrons 5 trigger secondary electrons 7 when they strike the surface-wave filter 6 to be investigated which is being driven by the modulator 2 via a power amplifier 10. The secondary electron signal thus arising is amplified in the preamplifier 8 known from the cited publication such that the secondary electron/alternating current signal is subsequently measured in the lock-in amplifier 9 and is compared to a rated value.

The deviation of the secondary electron/alternating current signal from the rated value is amplified in the lock-in amplifier 9 and, via the modulator 2, controls the amplitude of the power amplifier 10 which drives the surface-wave filter 6. The deviation of the secondary electron-alternating current signal from the rated value is thus a measure for the surface attenuation of the surface-wave filter 6 to be investigated.

The measurement ensues according to the sampling principle whereby the overall period of the alternating voltage/signal course to be locally measured is sampled in a short time ($<10^{-2}$s) by the pulsed electron beam.

In principle, the potential contrast on the surface-wave filters arises due to local potential differences. When a region exhibits the positive potential $U_P$, then an opposing field is built up above this region. Fewer secondary electrons 7 (SE) are therefore emitted from such regions with positive potential than are emitted from regions with nonpositive potential. The secondary electron current 7 derives from the integral over the secondary electron energy distribution N(E):

$$I = I_{PE} \int_{eU_B}^{50\,eV} N(E)dE.$$

Accordingly, $I_{PE}$ indicates the current of the primary electrons 5 which is kept constant during the measurement. $U_B=F(U_P)$ is the height of the potential barrier at the local measuring point. Secondary electrons with an energy which is smaller than $eU_B$ cannot leave the area of the surface-wave filter 6. Secondary electrons whose energy is greater than 50 eV hardly contribute to the secondary electron current 7.

When an alternating voltage with amplitude $U_P$ is present at the local measurement point, then a local secondary electron/alternating current signal with the amplitude $I_{AC}$ may be derived:

$$I_{AC} = I_{PE} \int_0^{ef(U_P)} N(E)dE.$$

This local secondary electron/alternating current signal with the amplitude $I_{AC}$ is superimposed on the secondary electron signal 7 which is amplified in the preamplifier 8 which represents a scintillator/photomultiplier combination. This locally measured secondary electron/alternating current signal is measured in the lock-in amplifier 9 and is compared to a rated value. The deviation from this rated value is further amplified in the lock-in amplifier 9 and, via the modulator 2, drives the amplitude of the power amplifier 10 which drives the surface-wave filter.

This alternating current with the amplitude $I_{AC}$ is kept constant in the specified control circuit (which essentially consists of the lock-in amplifier 9, of the modulator 2, and of the power amplifier 10) over the entire test for all local measurements. Since this alternating current amplitude $I_{AC}$ is constant during all local measurements over the entire surface-wave filter, the following relationship applies:

$$\int_0^{ef(U_P)} N(E)dE = \text{const.}$$

The alternating current amplitude $I_{AC}$ is constant during all local measurements throughout the entire test since the voltage $U_{Ei}=\alpha_i U_P$ applied to the input transducer of the surface-wave filter is controlled or varied. The factor $\alpha_i$ indicates the local attenuation of the wave in the filter at the local measuring point represented by the index i. The actual measured result is derived from the attenuation factor $\alpha_i$ which increases as a function of various measuring points of interest of index i on the surfaces of the surface-wave filter.

Since the value of the integral specified above is constant throughout all local measuring points, and since the secondary electron energy distribution N(E) is likewise constant throughout all local measuring points of the test, the limits of the integral must also be constant. Thus, since the upper limit particularly of said integral must be constant throughout all local measuring points of the test, the height of the potential barrier at the local measuring point $f(U_P)$ is constant throughout all local measuring points. Following therefrom, however, is that the quotient of the voltage $U_{Ei}$ applied to the input transducer as a function of the local measuring point and the local attenuation of the wave in the filter at the local measuring point $\alpha_i$ is constant for all local measuring points:

$f(U_P)=\text{const.}$ $U_{Ei}/\alpha_i=\text{const.}$

Thus, in the measurements according to the invention, for example two different local measuring points on the specimen, conclusions can be drawn concerning the attenuation $\alpha_i/\alpha_2$ between these points from the relationship of the input voltages $U_{E1}/U_{E2}.$ The attenuation as a function of the measuring points and as a function of the frequency reproduces specific filter characteristics.

It is expedient to amplify the signal emitted by the lock-in amplifier 9 with an operational amplifier 11.

A Dynotrac 391 A unit of the Ithaco company was employed as the lock-in amplifier 9.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A method for quantitative potential measurements of a surface-wave filter in which an electron beam measuring device having a scanned and pulsed electron beam makes local measurements at various regions of the surface wave filter by stroboscopically locally sampling in a short time with the pulsed electron beam an overall period of an alternating voltage at the various local regions, and by measuring secondary electron emissions from said various regions which are proportional to the respective alternating voltage at each of said regions, said electron beam measuring device having detection means for providing an alternating current signal proportional to the various secondary electron emissions, wherein the improvement comprises the steps of: providing an alternating driving voltage with an amplitude $U_{Ei}$ connected to an input transducer of the surface-wave filter, an alternating voltage of amplitude $U_P$ arising at each local region to be measured of the surface-wave filter; comparing the secondary electron/alternating current signal with an amplitude $I_{AC}$ created by the stroboscopic local sampling and which arises as a result of pulses of the electron beam at each local region and comparing this signal to a nominal value which is the same for all local region measurements of the filter; and determining a deviation of $I_{AC}$ from the nominal value and controlling the input voltage $U_{Ei}$ driving the surface-wave filter in accordance with said deviation from the nominal value such that the amplitude $U_{Ei}$ is adjusted for each local region being measured to maintain $I_{AC}$ substantially constant whereby amplitudes of the voltage $U_{Ei}$ for the various local regions of the surface wave filter may be utilized to determine surface attenuation of the surface-wave filter and as a function of a frequency of the driving alternating voltage to determine specific characteristics of the filter.

2. A method for quantitative potential measurement of surface-wave filters according to claim 1 including the step of measuring the alternating current signal with amplitude $I_{AC}$ in a lock-in amplifier and comparing the result to said nominal value.

3. A system for quantitative potential measurements of surface-wave filters in which an electron beam measuring means is provided having a pulsed and scanned electron beam for stroboscopic local measurements at each of various regions of the surface wave filter, and a detection and preamplifying means for detecting secondary electrons emitted from the surface wave filter as a result of pulses from the primary electrons and which result in an alternating current signal proportional to potentials arising at the various regions of the surface wave filter, wherein the improvement comprises: a generator means for producing a first alternating voltage; control means connected to the generator means for producing a drive voltage $U_{Ei}$ of varying amplitude to an input of the surface wave filter being measured; lock-in amplifier means for comparing the electron beam measuring means generated alternating current signal of an amplitude $I_{AC}$ for a respective region to a nominal value which is the same for all measurement regions and which outputs deviations from the nominal value for the various measuring locations, said deviations being connected to said control means so as to adjust the amplitude of the input voltage $U_{Ei}$ and to maintain the current $I_{AC}$ substantially constant for each of the various measuring locations, whereby changes in the amplitude of the alternating voltage $U_{Ei}$ for the various local regions of the surface-wave filter may be compared to determine surface attenuation characteristics of the surface-wave filter.

4. A system according to claim 3 wherein the control means comprises a modulator connected to the generator means and the modulator drives a power amplifier connected to the input transducer of the surface wave filter.

* * * * *